(12) United States Patent
Kume et al.

(10) Patent No.: US 7,867,803 B2
(45) Date of Patent: Jan. 11, 2011

(54) METHOD OF FABRICATING LIGHT EMITTING DEVICE AND COMPOUND SEMICONDUCTOR WAFER AND LIGHT EMITTING DEVICE

(75) Inventors: Fumitaka Kume, Annaka (JP); Masayuki Shinohara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 238 days.

(21) Appl. No.: 12/295,522

(22) PCT Filed: Mar. 19, 2007

(86) PCT No.: PCT/JP2007/055476

§ 371 (c)(1),
(2), (4) Date: Sep. 30, 2008

(87) PCT Pub. No.: WO2007/114033

PCT Pub. Date: Oct. 11, 2007

(65) Prior Publication Data

US 2009/0302335 A1 Dec. 10, 2009

(30) Foreign Application Priority Data

Mar. 31, 2006 (JP) .............................. 2006-099231

(51) Int. Cl.
*H01L 21/00* (2006.01)
(52) U.S. Cl. .................. 438/47; 438/46; 257/E33.023; 257/E33.049

(58) Field of Classification Search .................. 438/46, 438/47
See application file for complete search history.

(56) References Cited

U.S. PATENT DOCUMENTS 5,008,718 A 4/1991 Fletcher et al.

(Continued)

FOREIGN PATENT DOCUMENTS

JP 2004-047960 A 2/2004

(Continued)

*Primary Examiner*—Alexander G Ghyka
(74) *Attorney, Agent, or Firm*—Arent Fox LLP

(57) ABSTRACT

A Metal Organic Vapor Phase Epitaxy step of growing a light emitting layer section 24, composed of a first Group III-V compound semiconductor, epitaxially on a single crystal growth substrate 1 by Metal Organic Vapor Phase Epitaxy, and a Hydride Vapor Phase Epitaxial Growth step of growing a current spreading layer 7 on the light emitting layer section 24 epitaxially by Hydride Vapor Phase Epitaxial Growth Method, are conducted in this order. Then, the current spreading layer 7 is grown, having a low-rate growth layer 7a positioned close to the light emitting layer side and then a high-rate growth layer 7b, having a growth rate of the low-rate growth layer 7a lower than that of the high-rate growth layer 7b, so as to provide a method of fabricating a light emitting device capable of preventing hillock occurrence while forming the thick current spreading layer.

8 Claims, 3 Drawing Sheets

U.S. PATENT DOCUMENTS

| | | | |
|---|---|---|---|
| 6,218,280 B1 * | 4/2001 | Kryliouk et al. | 438/607 |
| 6,777,257 B2 * | 8/2004 | Shinohara et al. | 438/45 |
| 6,824,610 B2 * | 11/2004 | Shibata et al. | 117/89 |
| 6,870,190 B2 * | 3/2005 | Okuyama et al. | 257/79 |
| 7,145,180 B2 | 12/2006 | Shinohara et al. | |
| 2004/0023426 A1 | 2/2004 | Shinohara et al. | |
| 2006/0046325 A1 * | 3/2006 | Usui et al. | 438/21 |
| 2006/0118513 A1 * | 6/2006 | Faure et al. | 216/33 |
| 2007/0072320 A1 * | 3/2007 | Frayssinet et al. | 438/22 |
| 2007/0145405 A1 * | 6/2007 | Yamada et al. | 257/103 |

FOREIGN PATENT DOCUMENTS

| | | |
|---|---|---|
| JP | 2004-047973 A | 2/2004 |
| JP | 2004-047974 A | 2/2004 |
| JP | 2004-128452 A | 4/2004 |
| JP | 2004-179613 A | 6/2004 |
| JP | 2005-150772 A | 6/2005 |

\* cited by examiner

STEP 1

STEP 2

STEP 3

STEP 4

METHOD OF FABRICATING LIGHT EMITTING DEVICE AND COMPOUND SEMICONDUCTOR WAFER AND LIGHT EMITTING DEVICE

RELATED APPLICATIONS

This application is a National Stage entry of International Application No. PCT/JP2007/055476, filed Mar. 19, 2007, and claims the priority of Japanese Patent Application No. 2006-099231 filed on Mar. 31, 2006. The disclosures of the prior applications are hereby incorporated herein in their entirety by reference.

BACKGROUND OF THE INVENTION

1. Field of the Invention

This invention relates to a method of fabricating a light emitting device, a compound semiconductor wafer, and a light emitting device.

2. Description of the Related Art

[Patent Document 1] U.S. Pat. No. 5,008,718
[Patent Document 2] Japanese Laid-Open Patent Publication No. 2004-128452

A light emitting device having a light emitting layer section thereof composed of an $(Al_xGa_{1-x})_yIn_{1-y}P$ alloy (where, $0 \leq x \leq 1$, $0 < y \leq 1$; simply referred to as AlGaInP alloy, or more simply as AlGaInP, hereinafter) can be realized as a high-luminance device, by adopting a double heterostructure in which a thin AlGaInP active layer is sandwiched between an n-type AlGaInP cladding layer and a p-type AlGaInP cladding layer, both having a larger band gap than the active layer.

Taking an AlGaInP light emitting device as an example, by adopting hetero-formation on an n-type GaAs substrate, an n-type GaAs buffer layer, an n-type AlGaInP cladding layer, an AlGaInP active layer, a p-type AlGaInP cladding layer are stacked in this order, so as to form a light emitting layer section having a double heterostructure. Current is applied to the light emitting layer section via a metal electrode formed on a surface of the device. Here, the metal electrode acts as a light interceptor, so that it is formed, for example, so as to cover only a center portion of a main surface of the light emitting layer section, to thereby extract light from the peripheral region having no electrode formed thereon.

In this case, a smaller area of the metal electrode is advantageous in terms of improving the light extraction efficiency, because it can ensure a larger area for the light extraction region formed around the electrode. Conventional efforts have been made on increasing the amount of light extraction by effectively spreading current within the device through consideration on geometry of the electrode, but increase in the electrode area is inevitable anyhow in this case, having been fallen in a dilemma that a smaller light extraction area results in a limited amount of light extraction. Another problem resides in that the current is less likely to spread in the in-plane direction, because dopant carrier concentration, and consequently conductivity of the cladding layer is suppressed to a slightly lower level in order to optimize light emitting recombination of carriers in the active layer. This results in concentration of the current density into the region covered by the electrode, and consequently lowers a substantial amount of the light extraction from the light extraction region.

Thus, there is a publicly-known method of minimizing current density by providing a thick conductive transparent window layer (current spreading layer) between a light emitting layer section and an electrode (Patent Document 1). Also, in order to form a current spreading layer efficiently, there is a publicly-known method of forming a thin light emitting layer section by Metal Organic Vapor Phase Epitaxy Method (Hereinafter also called MOVPE method), on the other hand forming a thick current spreading layer by Hydride Vapor Phase Epitaxial Growth Method(Hereinafter also called HVPE method) (Patent Document 2).

SUMMARY OF THE INVENTION

However, when a thick current spreading layer is formed at a high rate by using Hydride Vapor Epitaxial Growth Method, crystal defect called hillock is likely to occur on a surface of the current spreading layer. Hillock has uneven shapes, and thus planarization is required by polishing the surface of the current spreading layer for a photolithography process or the like. Therefore, it is not efficient that the current spreading layer is formed even thicker for preliminary allowance of polishing stock removal. Also, when the current spreading layer is formed at a high rate, forward voltage (Vf) of the obtained light emitting device tends to increase.

This invention aims to provide a method of fabricating a light emitting device capable of suppressing hillock occurrence when a thick current spreading layer is formed by using Hydride Vapor Phase Epitaxial Growth Method, a compound semiconductor wafer used for fabricating the light emitting device, and a light emitting device obtained by the method of fabricating the light emitting device, and capable of maintaining forward voltage relatively low.

In order to solve the above problems, a first method of fabricating a light emitting device of this invention is a method of fabricating a light emitting device, of growing a light emitting layer section and a current spreading layer, each composed of Group III-V compound semiconductor, epitaxially in this order on a single crystal growth substrate, comprising, a Metal Organic Vapor Phase Epitaxy step of growing the light emitting layer section epitaxially on the single crystal growth substrate by Metal Organic Vapor Phase Epitaxy, and a Hydride Vapor Phase Epitaxial Growth step of growing the current spreading layer on the light emitting layer section epitaxially by Hydride Vapor Phase Epitaxial Growth Method, conducted in this order, wherein the current spreading layer is grown, having a low-rate growth layer positioned close to the light emitting layer section side and a high-rate growth layer following the low-rate growth layer.

Regarding the method of fabricating a light emitting device of this invention, for example, a light emitting layer section composed of $(Al_xGa_{1-x})_yIn_{1-y}P$ (where, $0 \leq x \leq 1$, $0 < y \leq 1$) including more than two kinds of Group III elements is grown by using Metal Organic Vapor Phase Epitaxy (MOVPE method) on a single crystal substrate (Metal Organic Vapor Phase Epitaxy step). On the other hand, it is efficient to form a current spreading layer, which is required to set thickness thereof relatively large in order to spread current fully in an in-plane direction, by using the Hydride Vapor Phase Epitaxial Growth Method (Hydride Vapor Phase Epitaxial Growth step). The HVPE Method is a method of conducting vapor phase growth of a III-V compound semiconductor layer by transforming Ga (Gallium) having low vapor pressure to GaCl which is easily vaporizable by reaction with hydrogen chloride in a quartz-made reacting furnace replaced with hydrogen gas, and then by reacting Group V element source gas and Ga through the GaCl as medium. Layer growth rate is approximately 1 μm/hour by the MOVPE method, whereas it is approximately 20 μm/hour by the HVPE method, so that the HVPE method can increase the layer growth rate more than the MOVPE method, and it can also form highly-efficiently a current spreading layer which is required a certain degree of thickness, so as to be able to suppress material costs far more compared with the MOVPE method. Also, with the HVPE method, expensive metal organic is not used as Group III element source, and a compounding ratio of Group V element source ($AsH_3$, $PH_3$ or the like)to the Group III element source is far less (for example, approximately 1/3), so that it is advantageous in view of cost.

However, in order to achieve high-rate growth of the current spreading layer, providing GaCl at a high concentration tends to cause hillock occurrence. Therefore, on an initial stage of the Hydride Vapor Phase Epitaxial Growth step, low-rate growth is conducted by suppressing a GaCl providing concentration low, so as to form a low-rate growth layer first. Then, hillock occurrence is suppressed even though conducting high-rate growth of a high-rate growth layer afterwards.

As explained above, hillock is likely to occur when providing GaCl at a high concentration, however pits is likely to occur when providing GaCl at a low providing concentration. A low rate growth layer of this invention is desired to be formed at such a low-rate that pits occur on a surface thereof. These pits are big enough to be visible with optical microscopes or the like when completing formation of the low-rate growth layer, however when the high-rate growth layer is formed thereon, they are hardly visible from a surface of the high-rate growth layer. By adjusting a growth rate of the high-rate growth layer reasonably, the current spreading layer having no hillock or pit occurrence on a surface thereof can be obtained.

When growing the low-rate growth layer at a growth rate equal to or less than 1/2 of that of the high-rate growth layer, hillock occurrence on a surface of the high-rate growth layer can be suppressed more certainly. However, when the growth rate of the low-rate growth layer is less than 1/5 of that of the high-rate growth layer, control of the growth rate tends to be difficult, so that it is desired to grow the low-rate growth layer at a growth rate equal to or more than 1/5 of that of the high-rate growth layer.

On the Metal Organic Vapor Phase Epitaxy step, when forming the light emitting layer section composed of $(Al_xGa_{1-x})_yIn_{1-y}P$ (where, $0 \leq x \leq 1$, $0 < y \leq 1$) including more than two kinds of Group III elements, if the current spreading layer is composed of GaP, GaP has a broader band gap than AlGaInP, so that light absorption is less likely to occur.

However, when the current spreading layer is composed of GaP and the light emitting layer section is composed of AlGaInP, difference of lattice constants of GaP and AlGaInP is large, and therefore, when forming the current spreading layer on the light emitting layer section directly by the HVPE method, crystallization of the current spreading layer deteriorates, so as to possibly induce deterioration of the light emitting characteristics. Therefore, by growing a GaP connection layer formed by the Metal Organic Vapor Phase Epitaxy as a layer continuous from the light emitting layer similarly to the light emitting layer section, and then growing a GaP current spreading layer by the Hydride Vapor Phase Epitaxial Growth Method, crystallization of the current spreading layer can be improved, so as to obtain a light emitting device having excellent light emitting characteristics. At this time, by growing the GaP current spreading layer as a GaP low-rate growth layer and a GaP high-rate growth layer so as to stack three GaP layers having different growth methods including the connection layer, both of suppression of hillock occurrence and improvement of crystallization can be achieved.

Therefore, it is desirable to that on the Metal Organic Vapor Phase Epitaxy step, a GaP connection layer is formed on the light emitting layer section composed of $(Al_xGa_{1-x})_yIn_{1-y}P$ (where, $0 \leq x \leq 1$, $0 < y \leq 1$) including more than two kinds of Group III elements, while connecting to the GaP connection layer a GaP low-rate growth layer is grown as the low-rate growth layer by the Hydride Vapor Phase Epitaxial Growth Method, and then a GaP high-rate growth layer is grown as the high-rate growth layer.

When the GaP layer is grown epitaxially at a temperature higher than 800° C. by the HVPE method, a quartz-made reacting furnace wall is sometimes etched with hydrogen or hydrogen chloride so that silicon can come off easily, and some part thereof can be taken into a growth starting area of the GaP layer as a large amount of silicon impurity. Also, when the GaP low-rate growth layer is grown epitaxially at a temperature lower than 700° C., it is difficult to forma single crystal layer. Thus, it is desirable to grow the GaP low-rate growth layer at a temperature equal to 700° C. or higher and equal to 800° C. or lower.

On the other hand, when hillock occurs on a surface of the current spreading layer, it is desirable to grow the GaP high-rate growth layer at a temperature higher than that of the GaP low-rate growth layer. Incorporation of a large amount of silicon impurity can be found practically only at a boundary surface between the GaP connection layer and the GaP low-rate growth layer, which is a growth starting area of the GaP layer by the HVPE method, and incorporation of silicon impurity is hardly found at a boundary surface between the GaP low-rate growth layer and the high-rate growth layer, so that it is allowed to grow the GaP high-rate growth layer epitaxially at a temperature higher than 800° C.

When growing the light emitting layer section by the MOVPE method, by using a single crystal substrate which is not off-angled, Group III atoms can not be randomly distributed within the light emitting layer section, so that undesirable regularization or biased distribution of atom arrangement can possibly occur. An area where these regularization and bias occur has a band gap energy value different from one initially expected, so as to distribute band gap energy of the entire light emitting layer section as a result, and then to induce variations of light emitting spectrum profile and center wavelength thereof. However, by providing the single crystal substrate with an appropriate off-angle, the above regulation and bias of the Group III atoms can decrease extensively, and a light emitting device having uniform light emitting spectrum profile and center wavelength can be obtained. Also, when using an off-angled single crystal substrate as a single crystal growth substrate, facet hardly occurs on a surface of the finally-obtained current spreading layer, and a current spreading layer having excellent smoothness can be obtained.

When composing the light emitting layer section with $(Al_xGa_{1-x})_yIn_{1-y}P$, the single crystal growth substrate can be a GaAs single crystal substrate provided with a principal axis off-angled in a degree range of 10° to 20°, both ends inclusive, while having a <100> direction or a <111> direction as a basic direction. Using a GaAs single crystal off-angled highly like this can improve a polishing effect of a surface of the GaP current spreading layer finally obtained by the Hydride Vapor Phase Epitaxial Growth Method further more. By using a single crystal substrate off-angled in a degree range equal to 1° or more and less than 10°, growth of uniform unevenness having small amplitudes like facet can be effectively prevented on a surface of the GaP current spreading layer, however crystal defect having large protruding shapes can be left quite a lot, so that it could possibly lead unconformity such as false detection or the like on a wire bonding step or the like. However, increasing the off-angle degree range to 10° to 20°, both ends inclusive, can effectively suppress occurrence of crystal defect having protruding shapes like this.

As explained above, by optimizing the off-angle of the single crystal growth substrate, a growth temperature of the current spreading layer by the HVPE method can be reduced extensively, and also a growth rate of the current spreading layer can be increased further more. However, because hillock can easily occur as the growth rate increases, is desirable to grow the GaP high-rate growth layer at a high growth rate, after growing the GaP low-rate growth layer at a low growth rate. As a result, a current spreading layer having a thickness equal to 100 μm or more, which is difficult to grow within a realistic time range by the MOVPE, can be obtained relatively highly efficiently as an advantage. However, a current spreading layer having thickness exceeding 250 μm tends to have large bend of the obtained substrate so as to be easily breakable, and thus it is desirable to have forming thickness of the current spreading layer (formed on the second epitaxial growth step) equal to 250 μm or less.

Therefore, the second method of fabricating a light emitting device of this invention comprises a Metal Organic Vapor Phase Epitaxy step of forming a light emitting layer section composed of $(Al_xGa_{1-x})_yIn_{1-y}P$ (where, $0 \leq x \leq 1$, $0 < y \leq 1$) including more than two kinds of Group III elements and a GaP connection layer on a GaAs single crystal substrate provided with a principal axis off-angled in a degree range of 10° to 20°, both ends inclusive, while having a <100> direction as a basic direction, and following the Metal Organic Vapor Phase Epitaxy step, a Hydride Vapor Phase Epitaxial Growth step of growing a GaP low-rate growth layer while connecting to the GaP connection layer, and continuously growing a GaP high-rate growth layer at a higher rate than that of the GaP low-rate growth layer, wherein thickness between the GaP connection layer and the GaP high-rate growth layer is 100 μm or more and 250 μm or less.

In a case that pits occur on a surface of the GaP low-rate growth layer, pits can easily occur on a surface of the GaP high-rate growth layer when it is being thin, so that it is desirable to grow the GaP high-rate growth layer having thickness equal to 100 μm or more.

Then, the compound semiconductor wafer of this invention allowed to be used for the above fabricating method comprises a light emitting layer section composed of $(Al_xGa_{1-x})_yIn_{1-y}P$ (where, $0 \leq x \leq 1$, $0 < y \leq 1$) including more than two kinds of Group III elements, a GaP connection layer by Metal Organic Vapor Phase Epitaxy, a GaP low-rate growth layer by Hydride Vapor Phase Epitaxial Growth Method, and a GaP high-rate growth layer grown at a higher rate than the GaP low-rate growth layer, stacked in this order on a GaAs single crystal substrate provided with a principal axis off-angled in a degree range of 10° to 20°, both ends inclusive, while having a <100> direction as a basic direction, wherein thickness between the GaP connection layer and the GaP high-rate growth layer is 100 μm or more and 250 μm or less.

Because, the compound semiconductor wafer of this invention is formed having a light emitting layer section composed of $(Al_xGa_{1-x})_yIn_{1-y}P$ (where, $0 \leq x \leq 1$, $0 < y \leq 1$) including more than two kinds of Group III elements on a GaAs single crystal substrate provided with a principal axis off-angled in a degree range of 10° to 20°, both ends inclusive, while having a <100> direction as a basic direction, thus a surface of the GaP current spreading layer is smooth and also occurrence of crystal defect, having protruding shapes with a large amplitude, is suppressed, and moreover, because the GaP current spreading layer by Metal Organic Vapor Phase Epitaxy and the GaP low-rate growth layer and the GaP high-rate growth layer by Hydride Vapor Phase Epitaxial Growth Method are stacked in this order, even though thickness from the GaP connection layer to the GaP high-rate growth layer is 100 μm or more and 250 μm or less, the GaP current spreading layer, which is excellent in crystallization and also suppressed in hillock occurrence, can be obtained. In this case, it is preferable that pits are formed on a surface of the GaP low-rate growth layer. Also, it is preferable that thickness of the GaP high-rate growth layer is 100 μm or more.

Also, a light emitting device of this invention is characterized that a light emitting layer section composed of $(Al_xGa_{1-x})_yIn_{1-y}P$ (where, $0 \leq x \leq 1$, $0 < y \leq 1$) including more than two kinds of Group III elements, a GaP connection layer by Metal Organic Vapor Phase Epitaxy, a GaP low-rate growth layer by Hydride Vapor Phase Epitaxial Growth Method, and a GaP high-rate growth layer grown at a higher rate than the GaP low-rate growth layer, are stacked in this order, and thickness from the GaP connection layer to the GaP high-rate growth layer is 100 μm or more and 250 μm or less. Sandwiching the GaP low-rate growth layer between the GaP connection layer and the GaP high-rate growth layer can improve crystallization around a boundary surface between the GaP connection later and the GaP current spreading layer, and also decrease incorporation concentration of impurities at the boundary surface between the GaP connection later and the GaP current spreading layer. As a result, decrease in forward voltage of the light emitting device can be achieved.

In this case, it is preferable that thickness of the GaP low-rate growth layer is 5 μm or more and 50 μm or less. The GaP low-rate growth layer having thickness less than 5 μm could not fully achieve effects in decreasing the forward voltage sometimes. On the other hand, the GaP low-rate growth layer having thickness exceeding 50 μm could saturate the effects, and incur unnecessary increase in cost sometimes.

BEST MODES FOR CARRYING OUT THE INVENTION

Paragraphs below will describe embodiments of this invention referring to the attached drawings.

Figure 1:
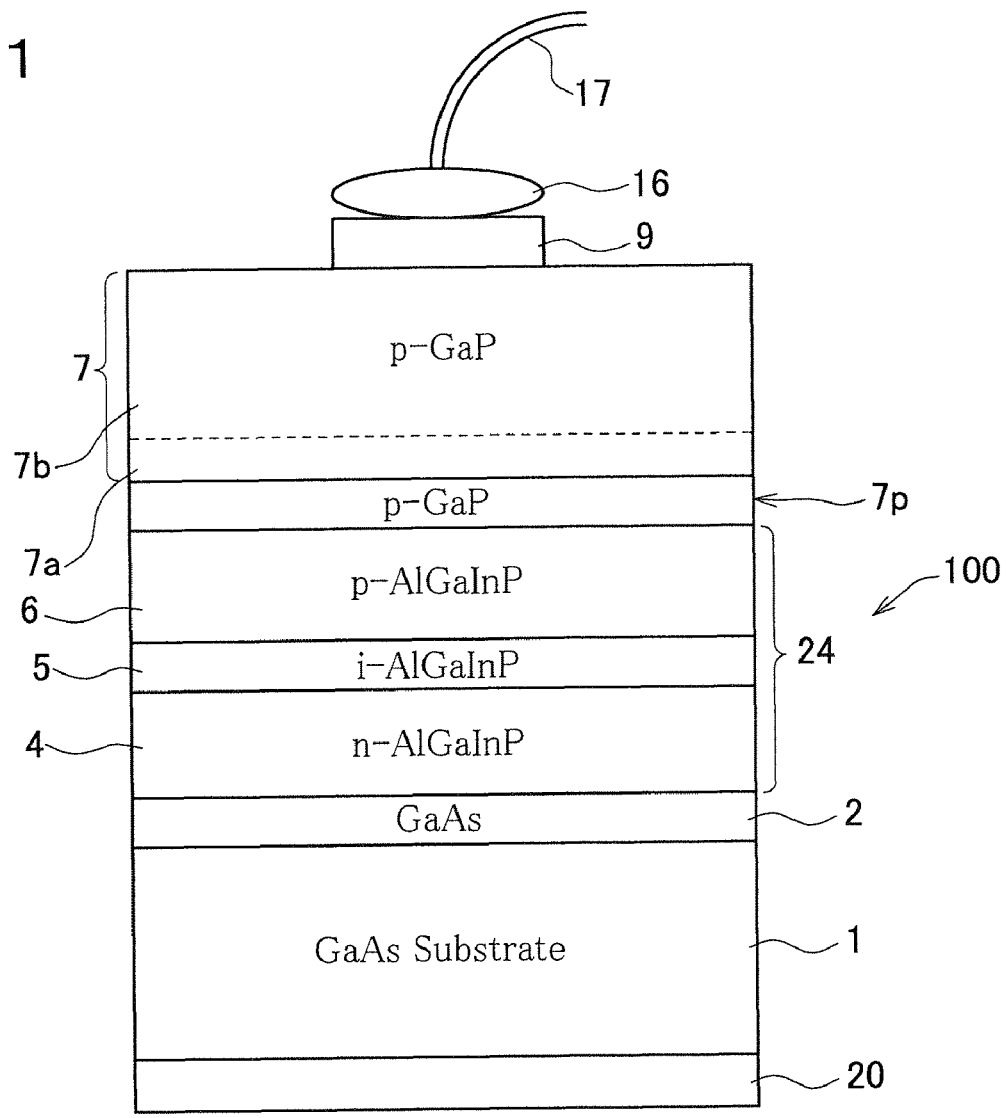
FIG. 1 is a schematic drawing showing an example of a light emitting device of this invention with a stack structure.

FIG. 1 is a schematic drawing showing one example of a light emitting device 100 fabricated by the fabricating method of this invention. The light emitting device 100 has a light emitting layer section 24 formed on a first main surface of an n-type GaAs single crystal growth substrate (it will be also called "substrate" hereinafter) 1 as a single crystal growth substrate. The substrate 1 is provided with a principal axis A off-angled in a degree range of 10° to 20°, both ends inclusive, while having a <100> direction as a basic direction (the principal axis A can be similarly off-angled having a <111> direction as basic). An n-type GaAs buffer layer 2 is formed so as to contact the first main surface of this substrate 1, and the light emitting layer section 24 is formed on the buffer layer 2. Then, a GaP connection layer 7p and a current spreading layer 7 are formed on the light emitting layer section 24, and a first electrode 9, for applying voltage to activate light emitting to the light emitting layer section 24, is formed on the current spreading layer 7. Also, a second electrode 20 is formed similarly on a entire second main surface side of the substrate 1. The first electrode 9 is formed at substantially center of the first main surface, and a region around the first electrode 9 acts as a light extraction region from the light emitting layer section 24. In order to connect electrode wire 17 to a center portion of the first electrode 9, a bonding pad 16 composed of Au or the like is disposed.

The light emitting layer section 24 has a structure in which an active layer 5 composed of a non-doped $(Al_xGa_{1-x})_yIn_{1-y}P$ alloy (where, $0≦x≦0.55$, $0.45≦y≦0.55$) is held between a p-type cladding layer 6 composed of a p-type $(Al_zGa_{1-z})_yIn_{1-y}P$ alloy (where, $x<z≦1$), and an n-type cladding layer 4 composed of an n-type $(Al_zGa_{1-z})_yIn_{1-y}P$ alloy (where, $x<z≦1$). The light emitting device 100 shown in FIG. 1 has the p-type AlGaInP cladding layer 6 disposed on the first electrode 9 side, and has the n-type AlGaInP cladding layer 4 disposed on the second electrode 20 side. Accordingly, polarity of the electrode is positive on the first electrode 9 side. It is to be noted that "non-doped" in the context herein means "not intentionally added with a dopant", and never excludes possibility of any dopant components inevitably included in the normal fabrication process (up to $1×10^{13}$ to $1×10^{16}/cm^3$ or around, for example).

The current spreading layer 7 is formed as a p-type GaP layer having Zn as a dopant. Formed thickness of the current spreading layer 7 is, for example, 100 μm or more and 250 μm or less. The current spreading layer 7 comprises a GaP low-rate growth layer 7a and a GaP high-rate growth layer 7b by Hydride Vapor Phase Epitaxial Growth Method stacked in this order. Thickness of the GaP low-rate growth layer 7a is, for example, 5 μm or more and 50 μm or less, and thickness of the GaP high-rate growth layer 7b is, for example, 100 μm or more.

Figure 3:
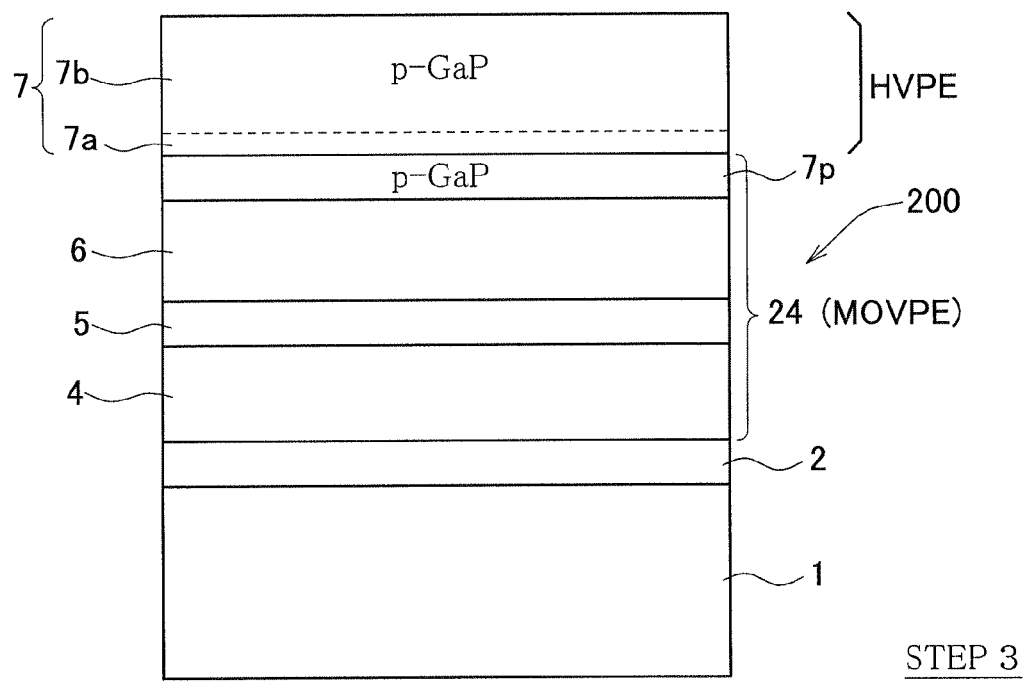
FIG. 3 is a conceptual drawing continuous from FIG. 2.
Figure 3:
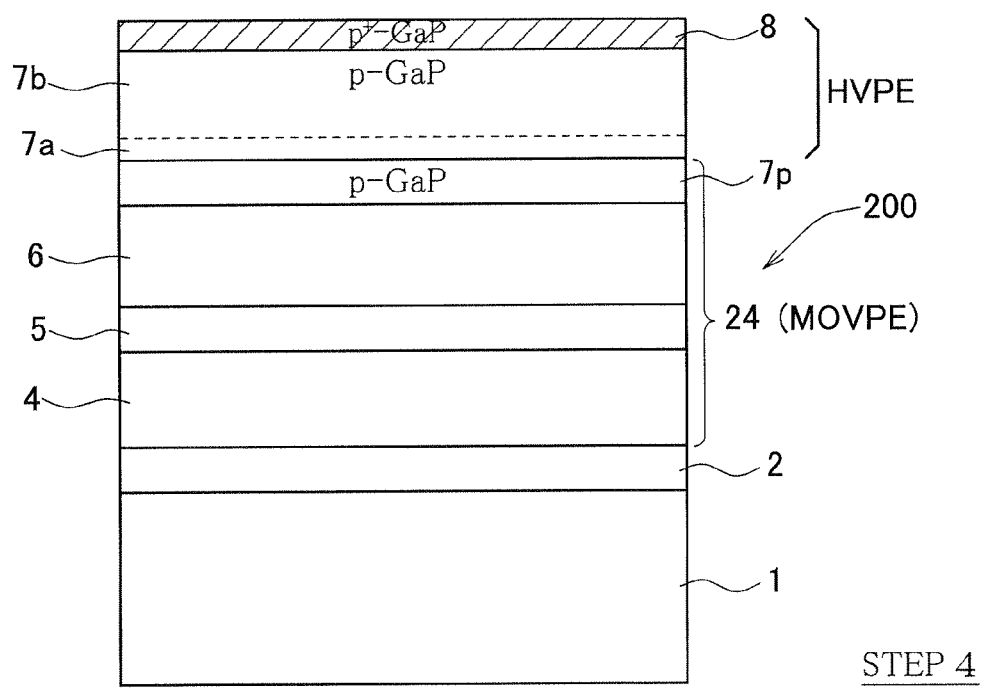

On a surface layer portion of the current spreading layer 7 including a main surface on a side forming the first electrode 9, a high-concentration doping layer 8, which has a higher Zn inclusion concentration than a residual area within the current spreading layer 7 by Zn addition diffusion, is formed (referred to FIG. 3). Zn carrier concentration of the current spreading layer 7 is, for example, $2×10^{18}/cm^3$ or more and $5×10^{19}/cm^3$ or less at the high-concentration doping layer 8, and $1×10^{17}/cm^3$ or more and $2×10^{18}/cm^3$ or less at other area than the high-concentration doping layer 8. However, this high-concentrate doping layer 8 can be omitted. Further, dopant inclusion concentration and H concentration at each layer are measured by Secondary Ion Mass Spectrometry (SIMS). Also, carrier concentration can be identified by a publicly known conductivity measurement.

Also, regarding this embodiments, the GaP connection layer 7p, the GaP low-rate growth layer 7a and the GaP high-rate growth layer 7b are formed from the same compound semiconductor (specifically GaP), however they can be formed with a different compound semiconductor from each other. For example, the first layer 7p can be $GaAs_{1-a}P_a$ (which has larger band gap energy than light energy corresponding to peak wavelength of the emitted light from the light emitting layer section), and the second layer 7a and the third later 7b can be GaP. Also, a p-type dopant is added respectively to the GaP connection layer 7p, the GaP low-rate growth layer 7a and the GaP high-rate growth layer 7b. As a p-type dopant, Zn can be adopted to all of 7p, 7a and 7b like this embodiment, however a dopant of the first layer 7p formed by MOVPE may be Mg and/or C, which is less likely to cause diffusion to the p-type cladding layer 6 side, and dopant of the second layer 7a and the third layer 7b formed by HVPE may be Zn.

A fabricating method of the light emitting device 100 in FIG. 1 will be explained, as follows.

Figure 2:
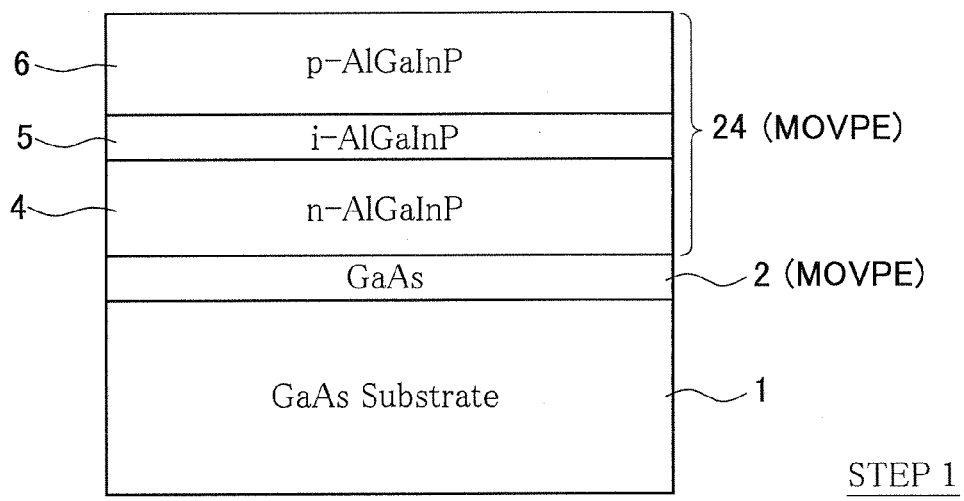
FIG. 2 is a conceptual drawing showing fabricating steps of a compound semiconductor wafer of this invention.
Figure 2:
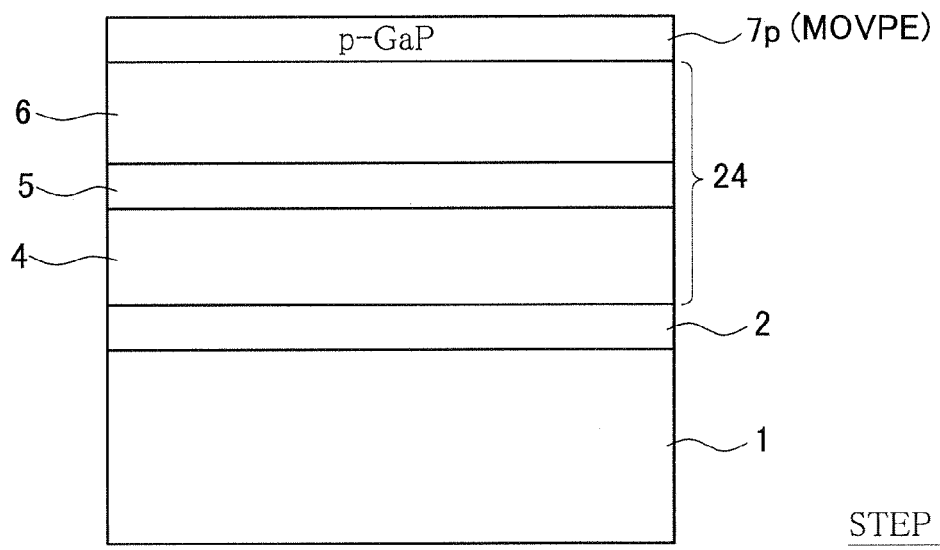

First, as shown in STEP 1 of FIG. 2, a GaAs single crystal substrate 1, provided with a principal axis off-angled in a degree range of 10° to 20°, both ends inclusive, while having a <100> direction as a basic direction, is prepared. Then as shown in STEP 2, on a first surface of the substrate 1, an n-type GaAs buffer layer 2, for example, of 0.5 μm, and next, an n-type cladding layer 4 of 1 μm (n-type dopant is Si), an active layer 5(non-doped) of 0.6 μm, also a p-type cladding layer 6 of 1 μm, and a p-type GaP connection layer 7p (p-type dopant is Mg: C from metal organic molecules can contribute as the p-type dopant), respectively composed of $(Al_xGa_{1-x})_yIn_{1-y}P$ as the light emitting layer section 24, are grown in this order epitaxially (Metal Organic Vapor Phase Epitaxy step). The above-described individual layers are epitaxially grown by any publicly-known MOVPE method. Source gases available as sources of the individual components Al, Ga, In (indium) and P (phosphorus) include the followings:

Al source gas: trimethyl aluminum (TMAl), triethyl aluminum (TEAl), etc.;

Ga source gas: trimethyl gallium (TMGa), triethyl gallium (TEGa), etc.;

In source gas: trimethyl indium (TMIn), triethyl indium (TEIn), etc.; and

P source gas: trimethyl phosphorus (TMP), triethyl phosphorus (TEP), phosphine ($PH_3$), etc.

Proceeded to STEP 3 in FIG. 3, a p-type GaP low-rate growth layer 7a and a GaP high-rate growth layer 7b are grown epitaxially immediately above a p-type GaP connection layer 7p by the HVPE method (Hydride Vapor Phase Epitaxial Growth step). A growth rate of the GaP low-rate growth layer 7a is set lower than that of the GaP high-rate growth layer 7b. More specifically, the GaP low-rate growth layer 7a is grown at a growth rate equal to $1/10$ or more and equal to $1/2$ or less of a growth rate of the high-rate growth layer 7b. The GaP low-rate growth layer 7a is formed at a fairly low rate, so that an amount of material supplied is suppressed extensively compared to usual, and pits can be found on a layer surface thereof after growth. Usually, the substrate 1 is not taken out from a Hydride Vapor Phase Epitaxial Growth equipment between the GaP low-rate growth layer 7a and the high-rate growth layer 7b, however when the substrate 1 is once taken out from the Hydride Vapor Phase Epitaxial Growth equipment, these pits can be observed.

The GaP low-rate growth layer 7a is grown at a temperature of 700° C. or more and 800° C. or less. Whereas, the GaP high-rate growth layer 7b is grown at a higher temperature than that of the GaP low-rate growth layer 7a, so that a higher growth rate can be ensured easier. As explained above, it's possible to obtain a compound semiconductor wafer 200 having thickness from the GaP connection layer 7p to the GaP high-rate growth layer 7b of 100 μm or more and 250 μm or less, thickness of the GaP low-rate growth layer 7a of 5 μm or more and 50 μm or less, and thickness of the GaP high-rate growth layer 7b of 100 μm or more, and also provided with surface status that hillock and pit occurrence is suppressed.

Proceeded to STEP 4 after completing growth of the GaP high-rate growth layer 7b, vacuum diffusion is conducted by replacing the compound semiconductor wafer 200 into another container, and circulating vapor of Group V element compound ($Zn_3As_2$, $Zn_3P_2$ or the like) while heating at 650° C. to 750° C. or the like (for example 700° C.). Then, Zn element is additionally diffused on an electrode forming side part of the GaP high-rate growth layer 7b, and thus a high-concentration doping layer 8 is formed.

By completing the above steps, a first electrode 9 and a second electrode 20 are formed by vacuum evaporation, and further a bonding pad 16 is disposed on the first electrode 9, and baked at an appropriate temperature for electrode bonding. Then, the second electrode 20 is bonded to a terminal electrode, which serves as a supporter as well, not shown in a figure, using conductive paste such as Ag paste or the like, on the other hand, wire 17 made of Au, while reaching the bonding pad 16 and another terminal electrode, is bonded and further resin mold is formed, so as to obtain a light emitting device 100.

Further, the GaP connection layer 7b may be omitted. Also, the GaAs single crystal substrate 1 on the second main surface side of the light emitting layer section 24 may be removed by etching and polishing (after STEP 3 of FIG. 3 or the like), and then bonding a transparent conductive substrate of GaP or the like. Also, instead of bonding a transparent conductive substrate, a current spreading layer (and also a connection layer), similarly to the first main surface side, may be grown. As this growth step, the same steps as the first main surface side above explained can be adopted to growth steps of this.

EXAMPLE 1

The compound semiconductor wafer 200 shown in FIG. 3 is formed so that each layer has thickness, as follows. Also, as a GaAs single crystal substrate, one provided with a principal axis off-angled in a degree of approximately 15°, while having a <100> direction as a basic direction is used. An n-type AlGaInP cladding layer 4, an AlGaInP active layer 5, a p-type AlGaInP cladding layer 6 and a GaP connection layer 7p are formed using a MOVPE equipment (Metal Organic Vapor Phase Epitaxy step), and a GaP low-rate growth layer 7a and a GaP high-rate growth layer 7b are formed in hydrogen atmosphere at approximately 760° C. using a Hydride Vapor Phase Epitaxial Growth equipment (Hydride Vapor Phase Epitaxial Growth step), so as to obtain the compound semiconductor wafer 200. The GaP low-rate growth layer 7a is formed at a growth rate of approximately 6 μm/hour, and the GaP high-rate growth layer 7b is formed at a growth rate of approximately 20 μm/hour. Also, thickness of each layer is, as follows;

The n-type AlGaInP cladding layer 4=1 μm;
The AlGaInP active layer 5=0.6 μm (light emitting wavelength 650 nm);
The p-type AlGaInP cladding layer 6=1 μm;
The GaP connection layer 7p=3 μm;
The GaP low-rate growth layer 7a=1 μm; and
The GaP high-rate growth layer 7b=150 μm.

When a main surface of the compound semiconductor wafer 200 obtained with the above-stated conditions, which was a main surface of the GaP high-rate growth layer 7b, was visually observed under fluorescent light, hillock was not found.

EXAMPLE 2

Under the same conditions as Example 1 except that the GaP low-rate growth layer 7a is 2 μm, a compound semiconductor wafer was fabricated by conducting the Metal Organic Vapor Phase Epitaxy step and the Hydride Vapor Phase Epitaxial Growth step similarly. When a main surface of the obtained GaP current spreading layer was visually observed under fluorescent light, hillock was not found. Also, forward voltage (Vf) thereof at 20 mA was approximately 1% higher than that of Example 1.

COMPARATIVE EXAMPLE 1

Under the same conditions as Example 1 except that the GaP low-rate growth layer 7a is not formed, a compound semiconductor wafer was fabricated by conducting the Metal Organic Vapor Phase Epitaxy step and the Hydride Vapor Phase Epitaxial Growth step. When a main surface of the obtained GaP current spreading layer was visually observed under fluorescent light, hillock was found on an entire surface thereof. Also, forward voltage (Vf) thereof at 20 mA was approximately 1% higher than that of Example 1.

What is claimed is:

1. A method of fabricating a light emitting device, of growing a light emitting layer section and a current spreading layer, each composed of Group III-V compound semiconductor, epitaxially in this order on a single crystal growth substrate, comprising;
   a Metal Organic Vapor Phase Epitaxy step of growing the light emitting layer section epitaxially on the single crystal growth substrate by Metal Organic Vapor Phase Epitaxy; and
   a Hydride Vapor Phase Epitaxial Growth step of growing the current spreading layer on the light emitting layer section epitaxially by Hydride Vapor Phase Epitaxial Growth Method, conducted in this order, wherein
   the current spreading layer is grown, having a low-rate growth layer positioned close to the light emitting layer section side and a high-rate growth layer following the low-rate growth layer.

2. The method of fabricating the light emitting device as claimed in claim 1, wherein the low-rate growth layer is formed at such a low rate that pits occur on a surface of the low-rate growth layer.

3. The method of fabricating the light emitting device as claimed in claim 1, wherein the low-rate growth layer is grown at a growth rate equal to 1/10 or more and equal to ½ or less of a growth rate of the high-rate growth layer.

4. The method of fabricating the light emitting device as claimed in claim 1, wherein on the Metal Organic Vapor Phase Epitaxy step, a GaP connection layer is formed on the light emitting layer section composed of $(Al_xGa_{1-x})_yIn_{1-y}P$ (where, $0 \leq x \leq 1$, $0 < y \leq 1$) including more than two kinds of Group III elements, while connecting to the GaP connection layer a GaP low-rate growth layer is grown as the low-rate growth layer by the Hydride Vapor Phase Epitaxial Growth Method, and then a GaP high-rate growth layer is grown as the high-rate growth layer.

5. The method of fabricating the light emitting device as claimed in claim 4, wherein the GaP low-rate growth layer is grown at a temperature of 700° C. or more and 800° C. or less.

6. The method of fabricating the light emitting device as claimed in claim 4, wherein the GaP high-rate growth layer is grown at a higher temperature than that of the GaP low-rate growth layer.

7. A method of fabricating a light emitting device, comprising;
   a Metal Organic Vapor Phase Epitaxy step of forming a light emitting layer section composed of $(Al_xGa_{1-x})_yIn_{1-y}P$ (where, $0 \leq x \leq 1$, $0 < y \leq 1$) including more than two kinds of Group III elements and a GaP connection layer on a GaAs single crystal substrate provided with a principal axis off-angled in a degree range of 10° to 20°, both ends inclusive, while having a <100>direction as a basic direction, and following the Metal Organic Vapor Phase Epitaxy step; and a Hydride Vapor Phase Epitaxial Growth step of growing a GaP low-rate growth layer while connecting to the GaP connection layer, and continuously growing a GaP high-rate growth layer at a higher rate than that of the GaP low-rate growth layer, wherein thickness between the GaP connection layer and the GaP high-rate growth layer is 100 μm or more and 250 μm or less.

8. The method of fabricating the light emitting device as claimed in claim 7, wherein the GaP high-rate growth layer is grown so as to have thickness of 100 μm or more.

* * * * *